United States Patent [19]

Ballato

[11] 4,389,275
[45] Jun. 21, 1983

[54] QUARTZ RESONATOR ANGLE CORRECTION

[75] Inventor: Arthur Ballato, Long Branch, N.J.

[73] Assignee: The United States of America as represented by the Secretary of the Army, Washington, D.C.

[21] Appl. No.: 361,657

[22] Filed: Mar. 25, 1982

[51] Int. Cl.³ .................... B44C 1/22; C03C 15/00; C03C 25/06
[52] U.S. Cl. .................... 156/626; 156/643; 156/654; 156/663; 156/345; 204/192 E; 204/298; 219/121 LM
[58] Field of Search ............ 156/626, 643, 654, 663, 156/345; 219/121 L, 121 LM; 204/192 E, 298

[56] References Cited

U.S. PATENT DOCUMENTS

| | | | |
|---|---|---|---|
| 3,489,564 | 1/1970 | Schaefer | 96/36 |
| 3,694,677 | 9/1972 | Guttwein et al. | 310/9.6 |
| 3,803,774 | 4/1974 | Miller | 51/283 |

OTHER PUBLICATIONS

Proceedings of the 30th Annual Symposium on Frequency Control, (1976), pp. 259–263, "A Method of Angle Correction", D. Husgen et al.
Proceedings of 1980 IEEE Ultrasonics Symposium, "What Saw Can Learn From Baw ...", T. Lukaszek et al.

Primary Examiner—William A. Powell
Attorney, Agent, or Firm—Nathan Edelberg; Jeremiah G. Murray; Edward Goldberg

[57] ABSTRACT

This invention relates to the correction of the orientation angle or angle of cut of quartz crystal blanks which substantially eliminates the initial formation of mesas and the subsequent lapping operation, as heretofore required, by providing a controlled linear etching gradient across opposing faces of a crystal plate or blank which is to be corrected. A beam for either ion etching or photolytic etching is repeatedly scanned across the face of the crystal plate in a multi-line raster pattern under the control of a microprocessor or mini-computer which controls the contour of the face being etched. X-ray apparatus monitors the etching and feeds information back to the computing apparatus for providing a closed loop control. The scanning includes either intensity modulation or velocity modulation of the beam, or succeeding scan lines are repetitively scanned a greater number of times than the respective preceding lines causing increasing amounts of the surface to be eroded as the scanning operation proceeds.

29 Claims, 6 Drawing Figures

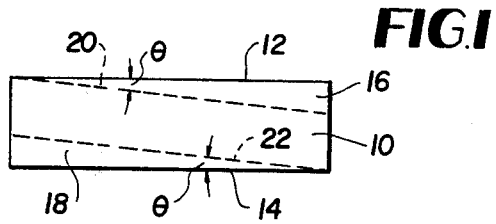
FIG.1
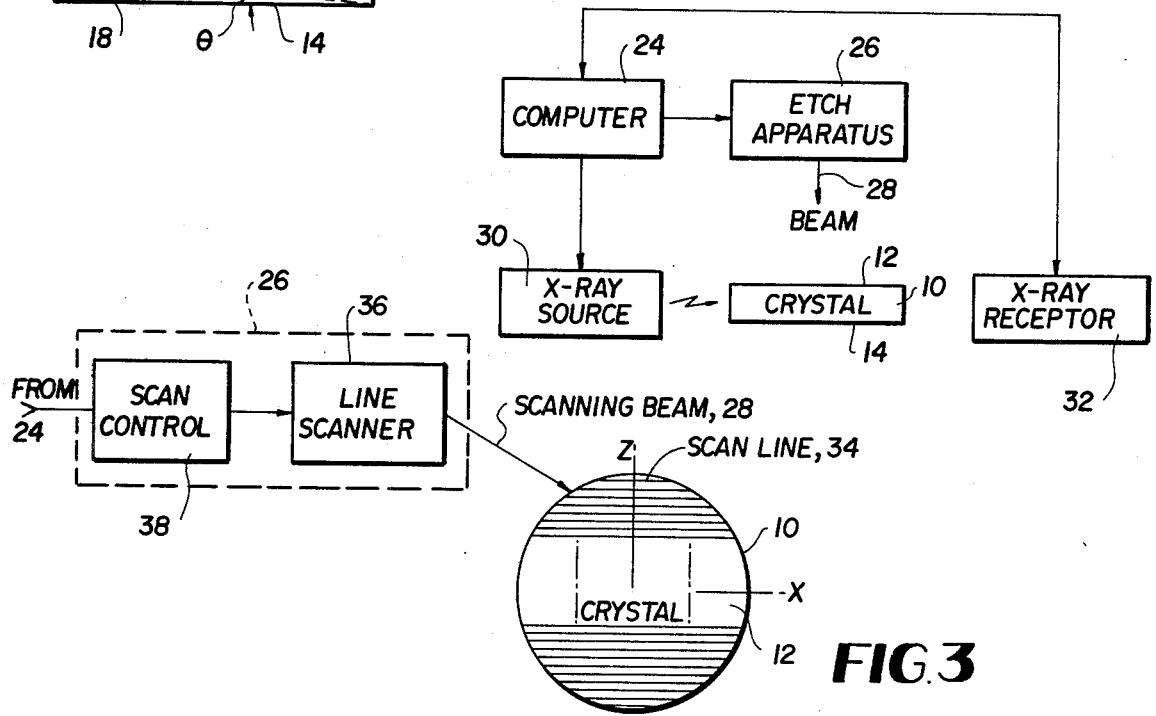
FIG.2
FIG.3
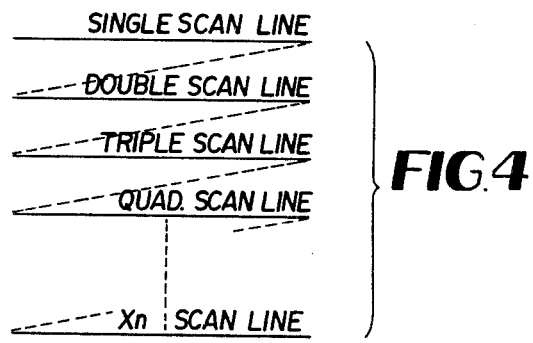
FIG.4
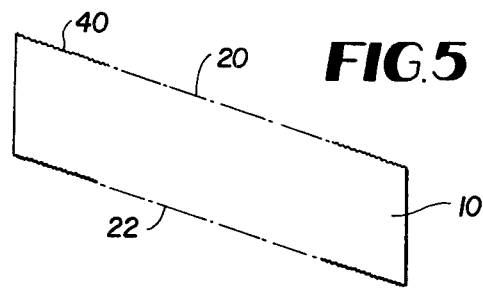
FIG.5
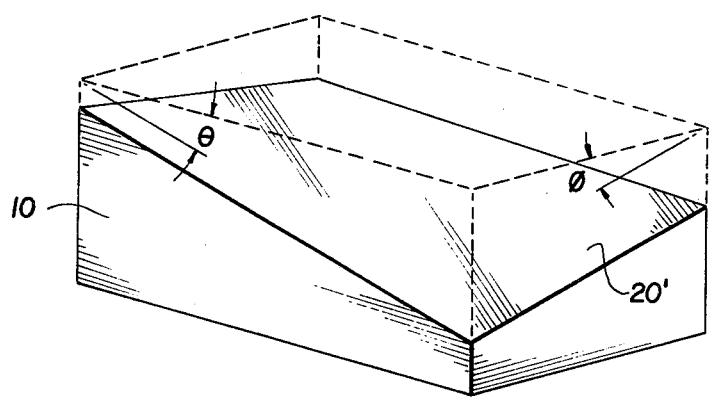
FIG.6

QUARTZ RESONATOR ANGLE CORRECTION

The invention described herein may be manufactured, used and licensed by or for the Government for governmental purposes without the payment to me of any royalties thereon.

CROSS REFERENCE TO RELATED APPLICATION

This application is related to the following application which is assigned to the assignee of the present invention: U.S. Ser. No. 361,655 entitled, "Analog Correction of Quartz Resonator Angle of Cut," filed on Mar. 25, 1982, in the name of Arthur Ballato, the inventor of the subject invention.

BACKGROUND OF THE INVENTION

This invention relates generally to quartz crystal resonators utilized for frequency control apparatus and the like and more particularly to a technique for accurately correcting the angle of cut of quartz crystal resonator blanks or plates.

It is well known that quartz crystal plates utilized for frequency control apparatus normally cannot be cut with sufficient accuracy where high precision applications are intended. Thus, following the initial cutting operation, the crystal blanks must have their orientation angles or angles of cut corrected prior to their installation in the respective equipment with which they are to be utilized.

In U.S. Pat. No. 3,803,774, entitled, "Technique For Correcting the Crystallo-Graphic Orientation Angle of Crystals by the Formation of Mesas and Double Face Lapping," issued to A. J. Miller on Apr. 16, 1974, there is disclosed a technique for correcting the angles of cut of quartz plates which involves first the formation of mesas by various techniques such as etching, machining or mounting a chip on the surface of the plate, followed by a double-face lapping operation until the mesas are removed, at which point the orientation angle has been changed the desired amount and the lapped upper and lower surfaces of the plate are substantially parallel. An inherent problem, however, arises in the masking of quartz plates during etching due to the fact that the masking material is attacked by the etchant and due to the complexity of the method of applying and removing the masking materials themselves. Various tapes, photoresists and solder-resists have been evaluated by several investigators, but to date none has proved to be satisfactory. Chemical and ion etching has been suggested in U.S. Pat. No. 3,694,677, entitled "VHF-UHF Piezoelectric Resonators," issued to G. K. Guttwein, et al. on Sept. 26, 1972. In U.S. Pat. No. 3,489,564, entitled, "Photolytic Etching of Silicon Dioxide," issued to D. L. Schaefer on Jan. 13, 1970, there is disclosed a process whereby etching of a predetermined pattern for decorative or optical purposes is achieved by exposing the surface of the body to be etched with radiation which has been previously treated by a photolytically decomposable liquid.

It is an object of the present invention, therefore, to provide an improved technique for correcting the angle of cut of a quartz resonator blank.

It is another object of the present invention to provide a technique for correcting the angle of cut of a quartz resonator blank or plate which substantially eliminates the need for mesa formation and lapping.

It is a further object of the invention to provide an automated correction process which is adapted for both singly and doubly rotated cuts.

SUMMARY

These and other objects are achieved in accordance with the subject invention by providing an etching gradient across the major faces of a quartz crystal resonator blank by means of a scanned etching beam of the ion or photolytic etching type under the control of digital computer apparatus. The blank is monitored by X-ray apparatus which is coupled back to the computer for providing a closed loop feedback control. During scanning, the beam is further intensity modulated or velocity modulated, or the beam is caused to repeat the same scan line an ever-increasing number of times for causing the depth of etching to increase linearly across the face of the blank as the beam proceeds line to line from beginning to end of the raster.

BRIEF DESCRIPTION OF THE DRAWINGS

FIG. 1 is a side plan view of a quartz crystal resonator blank whose top and bottom major faces are to be corrected by an angle $\theta$;

FIG. 2 is an electrical block diagram broadly illustrative of the apparatus for implementing the subject invention;

FIG. 3 is a block diagram illustrative of a scanning method of etching a quartz crystal resonator plate with the apparatus shown in FIG. 2;

FIG. 4 is a diagram illustrative of one type of raster scanning applicable to FIG. 3;

FIG. 5 is a side plan view of a crystal resonator blank or plate which has been corrected in angle by the subject invention; and FIG. 6 is a perspective view of a crystal resonator blank having a doubly rotated cut correction applied to one surface thereof.

DESCRIPTION OF THE PREFERRED EMBODIMENTS

The present invention is directed to the method and apparatus for providing a quartz resonator angle correction which substantially eliminates, but at least minimizes, the necessity of producing a mesa and the subsequent lapping operation. Additionally, the present invention is designed for a mass production line operation including an automated correction process which is adapted not only for singly rotated cuts of quartz crystals, but also to doubly rotated cuts.

Referring now to the drawings and more particularly to FIG. 1, reference numeral 10 denotes a quartz crystal resonator blank or plate having a pair of generally parallel major surfaces or faces 12 and 14 whose angle of cut relative to their orientation axes are to be corrected by an angle $\theta$ by removal of wedge-shaped sections 16 and 18 therefrom with inclined upper and lower faces 20 and 22 remaining following the correction process. In the prior art, the angle $\theta$ has been achieved, for example, by the formation of mesas on the major surfaces 12 and 14 followed by a double face lapping machine operation which results in the formation of the inclined surfaces 20 and 22.

Apparatus for carrying out an automated correction of the angle of cut of quartz crystal resonator blanks or plates is shown in FIG. 2 and includes digital computer apparatus 24 implemented, for example, by a mini-computer or microprocessor which is programmed to control etching apparatus 26 adapted for either ion etching or photolytic etching and, accordingly, develops an ion or photon beam 28 which is directed to the surface 12 of the crystal 10. The etching apparatus 26, moreover, can be duplicated when desired for simultaneously etching the opposite face 14 of the crystal since both faces are normally corrected. Accordingly, the present illustration (FIG. 2) is provided merely for purposes of simplification. In addition to the etching apparatus 26 being controlled by the computer 24, the angle correction operation is furthermore monitored by an X-ray examination system including an X-ray source 30, preferably under the control of the computer apparatus 24, and an X-ray receptor 32 which is adapted to form an image of the crystal 10 and the surface being etched and feed back information of the state of erosion of the face 12 which information is used by the computing apparatus 24 to perform calculations as to the amount and orientation of etching required and thereafter controls the etching apparatus accordingly.

Where ion etching, for example, is used to erode the face of the crystal, the beam 28 would typically be comprised of an argon beam. For photolytic etching, the surface 12 of the crystal 10 is first treated with a photolytic etchant which reacts with the quartz crystal material upon being radiated while the beam 28 for photolytic etching typically comprises a laser beam or other known type of photon source.

The preferred embodiment of the invention contemplates implementing the etching operation by scanning the surface 12 of the crystal being etched in accordance with a raster pattern comprised of a plurality of parallel scan lines. A typical example of a raster scan is shown in FIG. 3 and consists of a plurality of linear parallel scan lines 34 selectively oriented with respect to the X and Z crystal axes. The scanning beam 28 shown in FIG. 3 is controlled by a line scanner 36 and a scan control apparatus 38 which is included in the etching apparatus 28 shown in FIG. 2. Both of these equipments are well known in the electronics industry.

In order to etch out a linearly angulated surface contour from the surface 12, the scan pattern as shown in FIG. 4 is adapted to comprise an increasing repetition of individual scans so that, for example, the first scan line comprises a single scan, while the next line comprises a double scan and the third line is scanned three times and so on. This is provided because the total time spent by the beam 28 in any one place is proportional to the depth of etching desired at that location. Alternatively, the beam 28 can be intensity modulated as it scans, meaning that as the scan proceeds from the first to the nth line, the intensity of each scan line increases which also affects the depth of etching. The same effect can be achieved by modulating the scan rate (velocity modulation) of the beam 28 so that an overall etching gradient is generated over the crystal face 12, causing the angle $\theta$ (FIG. 1) to be formed leaving the configuration shown in FIG. 5. The resulting surface 20 consists of a number of minute steps 40 which correspond to the number of scan lines implemented. When the same procedure is performed for the opposite face of the crystal 10, a correspondingly parallel stepped face 22 as shown in FIG. 5 results. For all practical purposes, the faces 20 and 22 are smooth; however, if desired, further smoothing can be provided by grinding, buffing, polishing, or chemical etching.

While the foregoing description has been described with respect to etching along a single plane for implementing the angle $\theta$, a doubly rotated cut crystal also requires a correction of the angle $\phi$ as shown in FIG. 6. The resulting surface 20' would result, for example, from a combination of both repetitive line scanning and intensity modulation which can easily be provided by the computer implementation as shown in FIG. 2. The etched surface 20' would in effect look like a two dimensional step structure such as a Cuzco pyramid or a Ziggurat but having a very fine scale. Following such fabrication technique, a conventional chemical polishing step with $NH_4.HF_2$ can, when desired, be carried out.

Having thus shown and described what is at present considered to be the preferred method and apparatus for carrying out the subject invention, modifications and alterations will readily occur to those skilled in the art. Accordingly, the foregoing has been set forth by way of illustration and not limitation and therefore all modifications and variations coming within the spirit and scope of the invention as defined by the appended claims are herein meant to be included.

What is claimed is:

1. The method of correcting the angle of cut of a quartz crystal resonator blank or plate which substantially eliminates the need for producing a mesa and subsequent machine lapping thereof to provide an inclined corrected angle surface on said blank, comprising the steps of:
   (a) locating an uncorrected resonator blank in etching apparatus;
   (b) generating an etching beam; and
   (c) scanning at least one major face of said resonator blank with said etching beam and effecting an etching gradient pattern of a predetermined type across the surface thereof wherein surface erosion occurs by an increasing amount thereacross which thereby changes said angle of cut of said resonator blank.

2. The method of claim 1 wherein said scanning step comprises a raster type scanning of said major face.

3. The method of claim 2 wherein said etching beam comprises an ion etching beam.

4. The method of claim 2 wherein said major face is treated by a photolytic etchant and said etching beam comprises a photon beam.

5. The method of claim 2 wherein said raster scanning step comprises line scanning including a plurality of linear scan lines and wherein certain ones of said scan lines are repetitively scanned.

6. The method of claim 5 wherein each succeeding scan line of said plurality of scan lines is scanned at least an equal number of times as the preceding scan line.

7. The method of claim 6 wherein each succeeding scan line is scanned a greater number of times than the preceding scan line.

8. The method of claim 2 wherein said scanning step additionally includes the step of intensity modulating said beam during scanning.

9. The method of claim 2 wherein said scanning step additionally includes the step of modulating the number of scan steps of said beam.

10. The method of claim 2 wherein said scanning step additionally includes the step of velocity modulating said beam during scanning.

11. The method of claim 1 wherein said etching gradient pattern comprises a substantially linear etching gradient pattern in a selected direction across said major face.

12. The method of claim 11 wherein said resonator blank includes another major face opposite said at least one major face and additionally including step (c) on said another major face.

13. The method of claim 1 wherein said etching gradient pattern is computer controlled.

14. The method of claim 13 and additionally including the step of monitoring the etching of said at least one major face and feeding information back to a computer wherein said computer thereafter further controls said etching gradient pattern.

15. The method of claim 14 wherein said step of monitoring includes monitoring with X-rays.

16. The method of claim 1 wherein said scanning step comprises changing more than one angle of cut of said resonator blank.

17. Apparatus for correcting the angle of cut of a quartz crystal resonator blank having a pair of major faces, comprising:
   etching apparatus including means for generating an etching beam;
   means for directing said etching beam to at least one of said pair of major faces and scanning said beam thereacross in a predetermined pattern for eroding a selected portion of said major face in a substantially uniform manner for providing a corrected angle surface on said major face.

18. The apparatus as defined by claim 17 and additionally including means for controlling said means for scanning to provide a raster type scan pattern having a predetermined etching gradient.

19. The apparatus as defined by claim 18 wherein said etching gradient comprises a substantially linear gradient for defining said corrected angle surface.

20. The apparatus as defined by claim 18 wherein said controlling means comprises computer apparatus programmed to control the etched contour of said major face.

21. The apparatus as defined by claim 20 and including means for sensing the contour of the etched surface of said major face and providing information relative thereto to said computer apparatus whereby said computer apparatus further controls the etching of said major face.

22. The apparatus as defined by claim 21 wherein said means for sensing the etching contour comprises radiant energy apparatus.

23. The apparatus as defined by claim 22 wherein said radiant energy apparatus comprises X-ray apparatus.

24. The apparatus as defined by claim 17 wherein said means for generating an etching beam comprises means for generating an ion etching beam.

25. The apparatus as defined by claim 17 wherein said means for generating an etching beam comprises means for generating a photon beam.

26. The apparatus as defined by claim 17 wherein said means for scanning said beam includes means for intensity modulating said beam during scanning.

27. The apparatus as defined by claim 17 wherein said means for scanning additionally includes means for modulating the scan rate of said beam.

28. The apparatus as defined by claim 17 wherein said means for scanning said beam includes means for velocity modulating said beam during scanning.

29. The apparatus as defined by claim 17 wherein said means for scanning said beam includes means for scanning a plurality of linear scan lines in a raster scan and wherein each succeeding scan line is scanned a greater number of times than the preceding scan line.

* * * * *